United States Patent
Huang et al.

(10) Patent No.: US 6,762,436 B1
(45) Date of Patent: Jul. 13, 2004

(54) DOUBLE-SIDE DISPLAY STRUCTURE FOR TRANSPARENT ORGANIC LIGHT EMITTING DIODES AND METHOD OF MANUFACTURING THE SAME

(75) Inventors: Yan-Ming Huang, Taichung (TW); Gwo-Sen Lin, Taichung (TW); I-Cheng Kuo, Taichung (TW)

(73) Assignee: Windell Corporation, Taichung (TW)

( * ) Notice: Subject to any disclaimer, the term of this patent is extended or adjusted under 35 U.S.C. 154(b) by 0 days.

(21) Appl. No.: 10/347,244

(22) Filed: Jan. 21, 2003

(51) Int. Cl.[7] ............................................. H01L 27/15
(52) U.S. Cl. .................... 257/82; 257/228; 257/233; 257/184
(58) Field of Search .................... 257/82, 228, 233, 257/184, 43, 101

(56) References Cited

U.S. PATENT DOCUMENTS 5,739,545 A   4/1998  Guha et al.
6,420,031 B1  7/2002  Parthasarathy et al.
6,541,908 B1 * 4/2003  Cheung et al.
6,686,699 B2 * 2/2004  Yumoto .................... 315/169.3

\* cited by examiner

Primary Examiner—Fetsum Abraham
(74) Attorney, Agent, or Firm—Birch, Stewart, Kolasch & Birch, LLP

(57) ABSTRACT

A double-side display structure for an organic light emitting diode (OLED) and a method of manufacturing the same includes: plating an organic layer on an OLED element by vaporization; plating an organic protection layer on the organic layer to protect various organic layers from being damaged by electron bombardment during the OLED element subject to ITO sputtering in the later processing; plating an electron injecting layer and a thin metal film of a mating energy level on the organic protection layer; and plating a transparent conductive film on the electron injecting layer and the thin metal film to increase conductivity and protect the thin metal film from corrosion.

13 Claims, 3 Drawing Sheets

US 6,762,436 B1

DOUBLE-SIDE DISPLAY STRUCTURE FOR TRANSPARENT ORGANIC LIGHT EMITTING DIODES AND METHOD OF MANUFACTURING THE SAME

FIELD OF THE INVENTION

The present invention relates to a double-side display structure for transparent organic light emitting diodes (OLEDs) and a method of manufacturing the same.

BACKGROUND OF THE INVENTION

OLEDs are generally made by vacuum sputtering an organic material and a metal film on a substrate. A conventional OLED can emit light only from a single side. It is commonly used on handsets, PDAs, digital cameras, and the like. Recently, OLED also has been used on display devices similar to projecting films that may be rolled like a curtain when not in use or become a transparent OLED to be extended on the windshield or mirror of cars for head-up display applications so that drivers can view road maps on the windshield while driving. In order to make the OLED meeting the requirement of transparent cathode structure, there is a need to develop a transparent cathode structure to serve as a double-side display OLED element.

At present the techniques of the transparent cathode structure can be grouped in two types. The first type directly plates a plurality of thin (a few nm) metal and inorganic films on an electron transport layer (such as Alq), such as U.S. Pat. No. 5,739,545, entitled "Organic light emitting diodes having transparent cathode structures". In this patent, the transparent cathode structure consists of a low work function metal in direct contact with the electron transport layer of the OLED covered by a layer of wide bandgap semiconductor. Calcium is the preferred metal because of its relatively high optical transmissivity for a metal and because of its proven ability to form a good electron injecting contact to organic materials. However, such a transparent cathode structure with Ca (5 nm)/ZnSe (20 nm)/Al (5 nm) films plating on the Alq layer does not has an electron injecting layer to increase the efficiency. After light passes through various films (Ca/ZnSe/Al), the optical transmissivity drops and illumination of the lighting element decreases. Moreover the outmost Al film is easily affected by moisture. As a result, corrosion occurs and elements tend to degrade.

The technique of the second type transparent cathode structure is to plate an organic protection film (such as BCP, or CuPc) on the electron transport layer (such as Alq), then plate a transparent and conductive Indium Tin Oxide (ITO) film thereon. U.S. Pat. No. 6,420,031, entitled "Highly transparent non-metallic cathodes" discloses such a technique. The highly transparent non-metallic cathode of the OLED employs a thin CuPc film (copper phthalocyanine) capped with a film of low-power, radio-frequency sputtered indium-tin-oxide (ITO). The transparent cathode structure has two films CuPc/ITO plated on the Alq layer. Such a structure has a shortcoming, i.e. electrons have to pass over a great energy level difference (about 1.2 eV) when being transported from the cathode ITO to the organic protection film CuPc. Transportation of electrons is more difficult, as shown in FIG. 1.

SUMMARY OF THE INVENTION

Therefore the primary object of the invention is to resolve the aforesaid disadvantages. The invention employs a transparent cathode structure to replace the conventional opaque cathode structure for making a double-side transparent OLED. When the transparent OLED element emits light, the light projects from two sides of the element (anode and cathode) to form a double-side lighting display device.

In order to achieve the foregoing object, the transparent cathode structure of the invention includes an organic protection layer, an electron injecting layer, a thin metal layer, and a transparent conductive film. The organic protection layer is to protect various organic layers of the OLED elements from being damaged caused by direct electron bombardment during ITO sputtering. The electron injecting layer and the thin metal layer of the mating energy level can increase electron injecting efficiency. The transparent conductive film is to increase the conductivity of the electrode and protect other films from corrosion. According to the invention, electron transportation from the transparent cathode ITO to the electron injecting layer LiF/Al passes over an energy level difference of merely about 0.5 eV. Thus electron transportation is smoother, and element lighting efficiency increases.

The foregoing, as well as additional objects, features and advantages of the invention will be more readily apparent from the following detailed description, which proceeds with reference to the accompanying drawings.

The present invention will become more fully understood from the detailed description given hereinbelow and the accompanying drawings which are given by way of illustration only, and thus are not limitative of the present invention, and wherein:

DESCRIPTION OF THE PREFERRED EMBODIMENT

Figure 1:
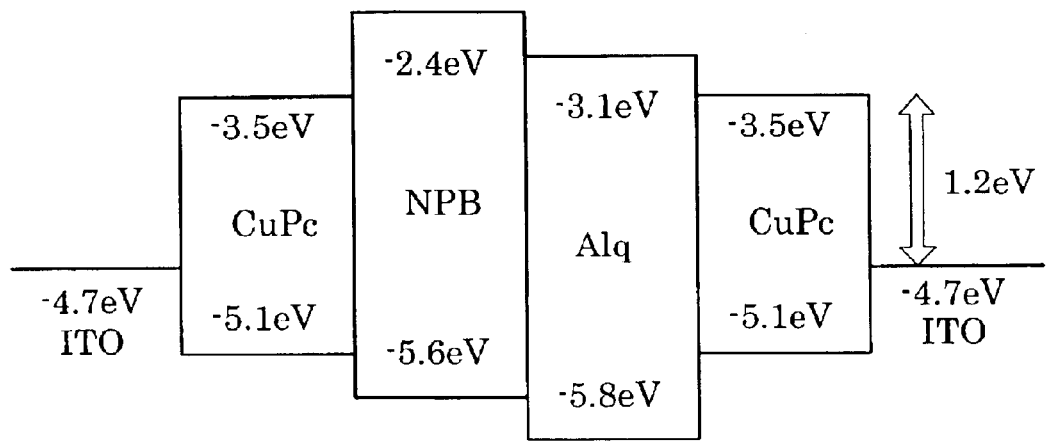
FIG. 1 is a schematic view of the energy level for electron transport of a conventional technique.
Figure 2:
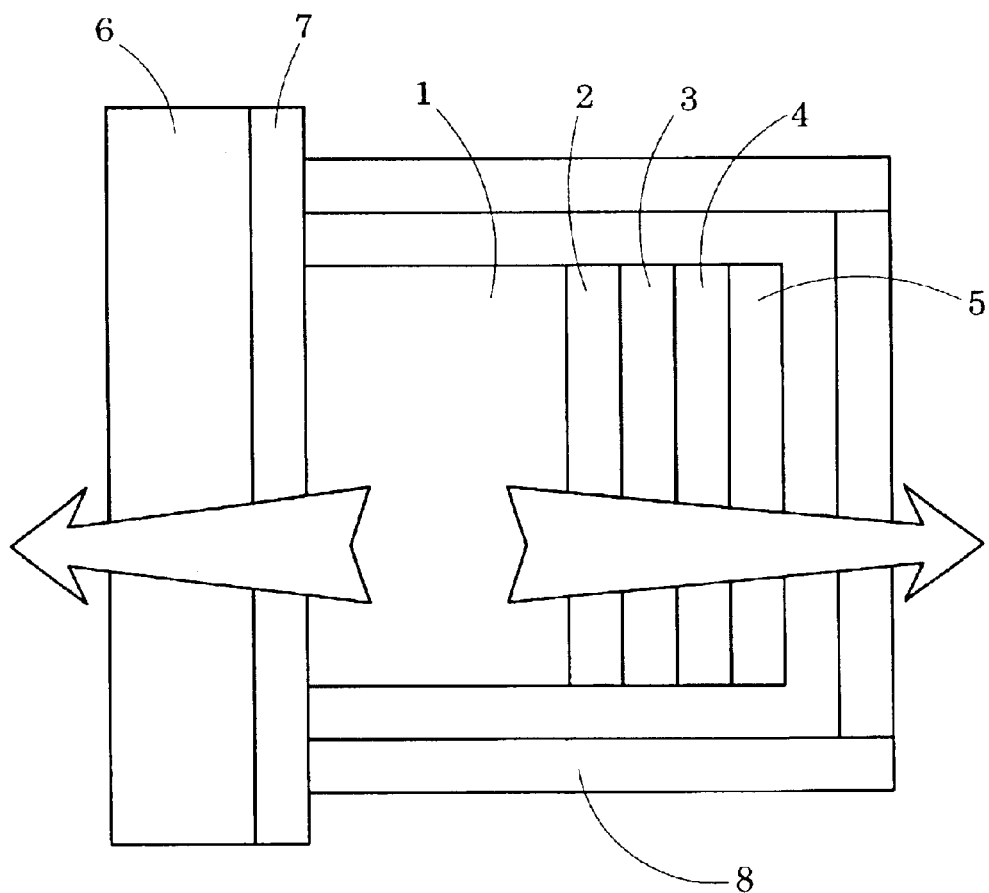
FIG. 2 is a schematic view of the transparent OLED of the invention.

Referring to FIG. 2, the double-side display structure for an OLED according to the invention mainly uses a transparent cathode structure to replace the conventional opaque cathode structure to fabricate an OLED that is transparent on both sides. When the transparent OLED element generates light, the light may emit from both sides (cathode and anode) to form a double-side illuminating display device.

The transparent cathode structure is bonded by an organic layer and a metal transparent layer. Hence light transparency is an important factor for producing the transparent cathode structure. The impact of the cathode structure to the lighting characteristics of the whole element also should be taken into account. Therefore the transparent cathode structure of the OLED of the invention consists of an organic protection layer, an electron injecting layer, a thin metal layer, and a transparent conductive film.

When making the aforesaid transparent cathode structure, first, plate the OLED element to form an organic layer 1 by a vaporizing process. The organic layer 1 includes at least, but not limited to, an electron hole transport layer, a lighting layer, an electron transport layer, etc.

After the organic layer 1 is formed on the OLED element, plate an organic protection layer 2 on the said organic layer 1 at a thickness ranging from dozens of nm to hundreds of nm. The organic protection layer 2 aims at protecting the various organic layers from being damaged by electron bombardment when the OLED element is subject to ITO sputtering in the later processing. The organic protection layer 2 may be selected from materials including, but not limited to, CuPc, BCP (2,9-bimethyl, 4,7-biphenzyl-1,10-phenanthroline) or PTCDA (3,4,9,10-perylene tetracarboxylic dianhydride), etc.

In addition, after the organic protection layer 2 was formed, directly plate an electron injecting layer 3 and a thin metal film 4 of a mating energy level on the organic protection layer 2. The electron injecting layer 3 may be selected from materials including, but not limited to, LiF, Rb, Cs or the like, and be formed with a thickness ranging from 0.1 nm to several nm. The thin metal film 4 may be selected from materials including, but not limited to, Al, In, Zn, Ag, Mn, Cr, Mo, Ti, Au, or the like, and be formed with a thickness of several nm.

After the electron injecting layer 3 and the thin metal film 4 have been plated and formed, plate a transparent conductive film 5 to increase conductivity and protect the thin metal film 4 from corrosion. The transparent conductive film 5 may be selected from materials including ITO, IZO, or the like. By means of the manufacturing method set forth above, the transparent cathode structure is formed.

The transparent double-side display OLED made from the transparent cathode structure set forth above includes a glass substrate 6, an ITO layer 7 plated on the substrate 6, and an organic layer 1 formed on the ITO layer 7. Then on the organic layer 1, an organic protection layer 2, an electron injecting layer 3, a thin metal film 4 and a transparent conductive film 5 are plated thereon in this order. Finally, the organic layer 1, organic protection layer, 2, electron injecting layer 3, thin metal film 4, and transparent conductive film 5 are encased by a transparent package cap 8.

When the organic layer 1 of the transparent OLED emits light, the light generated by the anode of the OLED passes through the ITO layer 7 and the transparent glass substrate 6 and projects outwards, while the light generated by the cathode passes through the organic protection layer 2, electron injecting layer 3, thin metal film 4, and transparent conductive film 5 and projects outwards. Thus it becomes a display device displaying on both sides.

Figure 3:
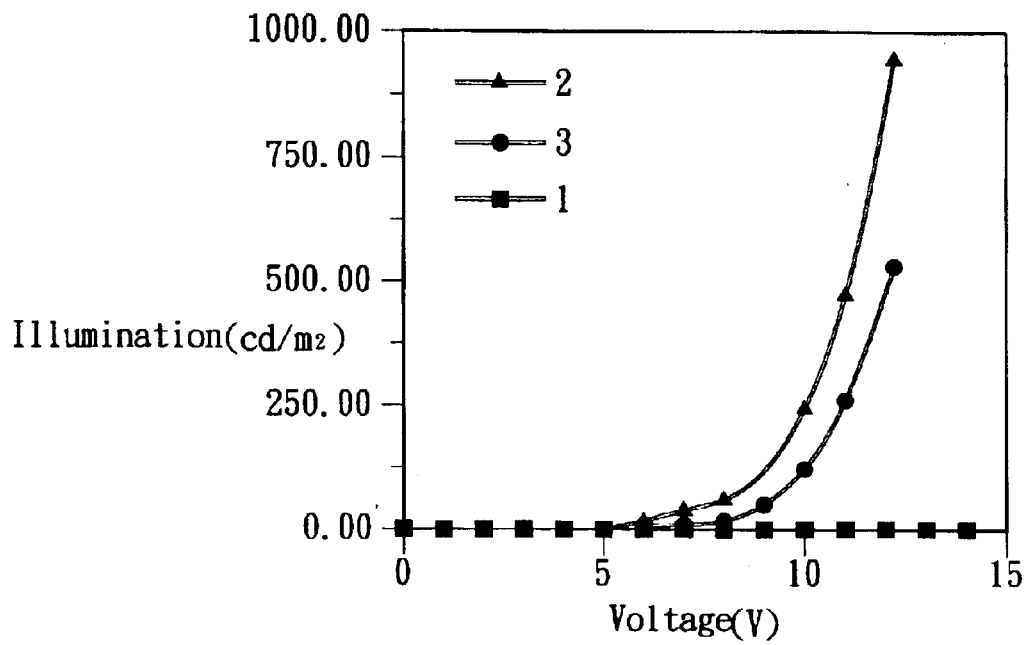
FIG. 3 is a chart showing the relationship of illumination and voltage according to the invention.
Figure 4:
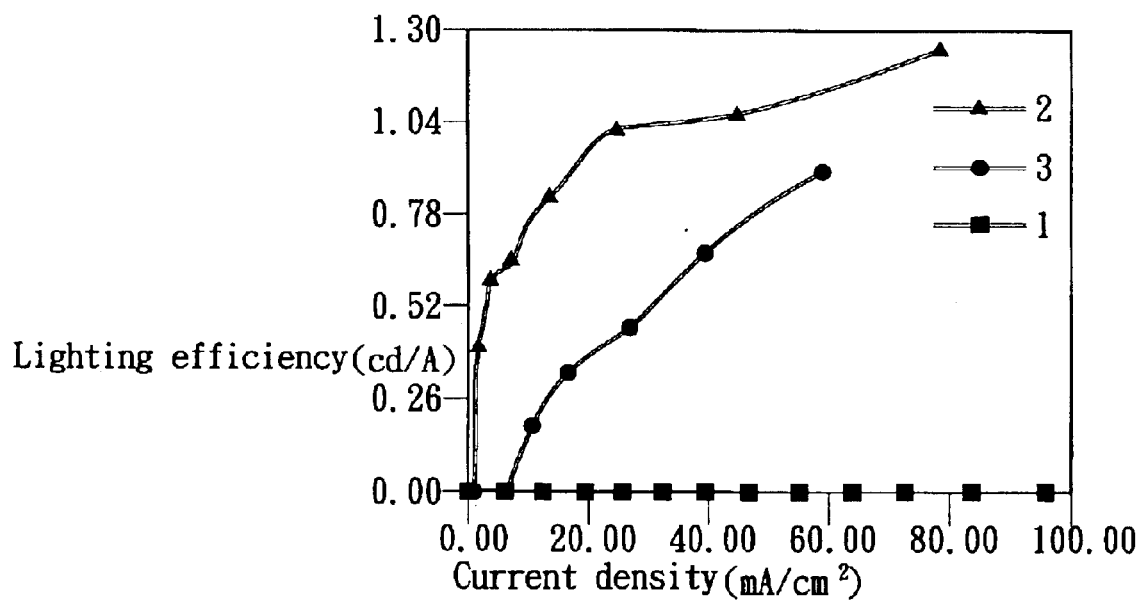
FIG. 4 is a chart showing the relationship of lighting efficiency and current density according to the invention.

Refer to FIGS. 3 and 4 for the relationship of illumination and voltage, and lighting efficiency and current density according to the invention. In order to facilitate understanding, the transparent cathode structure of the invention, in addition to the organic protection layer 2, electron injecting layer 3, thin metal film 4, and transparent conductive film 5, also includes various types of composition structures for testing to prove the applicability of the invention. The structure 1 consists of CuPc/NPB/Alq+C545T/Alq/BCP/ITO. The structure 2 consists of CuPc/NPB/Alq+C545T/Alq/BCP/LiF/Al/ITO. The structure 3 consists of CuPc/NPB/Alq+C545T/Alq/LiF/Al/ITO. As shown in FIG. 3, the structure 2 has organic protection layer BCP, thus has a greater illumination than structure 3 which does not have organic protection layer. This is because the organic protection layer can protect various layers from being damaged by direct electron bombardment during the ITO sputtering process.

Moreover, the illumination of the element structure 2 which has electron injecting layer and thin metal film also is greater than that of the element structure 1 which does not have electron injecting layer and thin metal film. Similarly, FIG. 4 shows that the lighting efficiency of the element structure 2 that has organic protection layer BCP is greater than that of the element structure 1 or 3.

Figure 5:
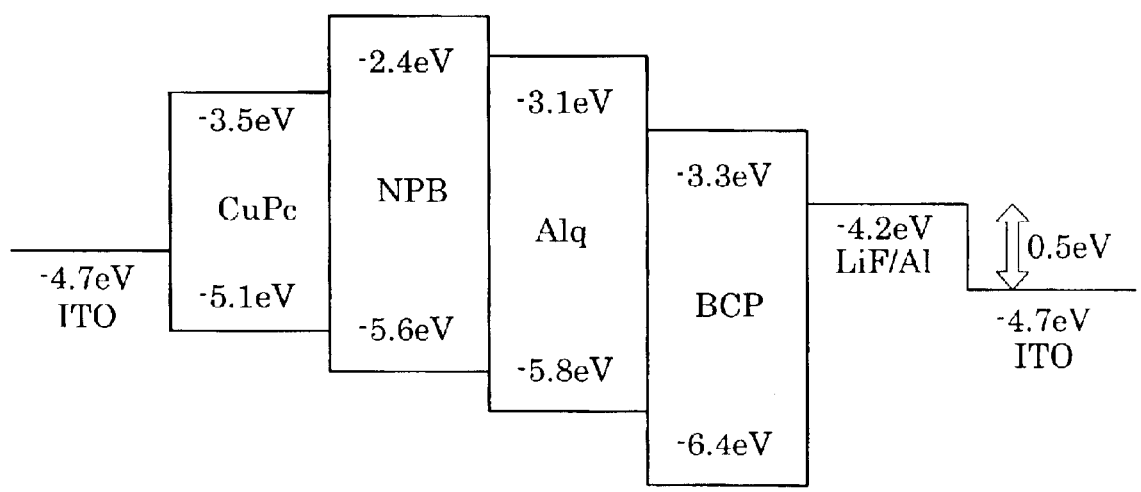
FIG. 5 is a schematic view of the energy level for electron transport according to the invention.

Refer to FIG. 5 for the transparent cathode structure of the invention that adopts the design of organic protection layer/electron injecting layer/thin metal film/transparent conductive film. The organic protection layer (CuPc, BCP or PTCDA) aims to protect various organic layers of the element from being damaged by direct electron bombardment during ITO sputtering process. The electron injecting layer (such as LiF, Rb, Cs, or the like) and the thin metal film of a mating energy level (such as Al, In, Zn, Ag, Mn, Cr, Mo, Ti, Au, etc.) can increase electron injecting efficiency. The transparent conductive film (such as ITO, IZO, etc.) can increase electrode conductivity and protect other films from corrosion. When the transparent cathode ITO transmits electrons to the electron injecting layer LiF/Al, the energy level to be passed over is only about 0.5 eV. Thus electron transport is smoother and element lighting efficiency may increase.

In summary, the transparent cathode structure of the invention that adopts the design of organic protection layer/electron injecting layer/thin metal film/transparent conductive film provides the following advantages:

1. The organic protection layer can protect the element from being damaged by direct electron bombardment during the later ITO sputtering process, thus can increase the lighting efficiency and service life of the element.
2. The electron injecting layer/thin metal film can increase electron injecting efficiency and improve element lighting efficiency.
3. The transparent conductive film can reduce electrode impedance and corrosion of various layers.
4. The transparent cathode structure provides an energy level design that makes electron transport from the cathode to the anode smoother.

Furthermore, the invention can be adapted on passive or active organic EL display devices, such as making OLED elements on a glass substrate of an amorphous silicon TFT (thin film transistor), or employing OLED elements in the active organic EL display devices that must use the design of emitting light from the cathode surface, the transparent cathode structure of the invention may be used without the concern of TFT aperture ratio.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A double-side display structure for transparent organic light emitting diodes using a transparent cathode structure to fabricate an organic light emitting diode that is transparent on two sides, the transparent organic light emitting diode structure comprising:

a substrate;

an Indium-Tin-Oxide layer located on the substrate; and a transparent cathode structure located on the Indium-Tin-Oxide layer;

wherein the anode and the cathode of the organic light emitting diode generate light for projecting outwards when an organic layer of the transparent organic light emitting diode is lighting to form a display device displaying on two sides;

wherein the transparent cathode structure includes an OLED organic layer, an organic protection layer, an electron injecting layer, a thin metal film and a transparent conductive film.

2. The double-side display structure of claim 1, wherein the substrate is a transparent glass.

3. The double-side display structure of claim 1, wherein the OLED organic layer includes at least an electron hole transport layer, a lighting layer, and an electron transport layer.

4. The double-side display structure of claim 1, wherein the organic protection layer is selected from a group of materials consisting of CuPc, BCP or PTCDA.

5. The double-side display structure of claim 4, wherein the organic protection layer has a thickness ranging from several dozen nm to several hundred nm.

6. The double-side display structure of claim 1, wherein the electron injecting layer is selected from a group of materials consisting of LiF, Rb, or Cs.

7. The double-side display structure of claim 4, wherein the electron injecting layer has a thickness ranging from 0.1 nm to a plurality of nm.

8. The double-side display structure of claim 1, wherein the thin metal film is selected from a group of materials consisting of Al, In, Zn, Ag, Mn, Cr, Mo, Ti, or Au.

9. The double-side display structure of claim 8, wherein the thin metal film has a thickness of a plurality of nm.

10. The double-side display structure of claim 1, wherein the transparent conductive film is selected from a group of materials consisting of indium tin oxide or indium zinc oxide.

11. The double-side display structure of claim 1, further having a transparent package cap for encasing the transparent cathode structure.

12. The double-side display structure of claim 1, wherein the transparent cathode structure is employed on passive and active organic EF display devices that use a glass substrate of an amorphous silicon TFT to make OLED elements, or employ OLED elements in the active organic EL display devices that have a design of emitting light from the cathode surface.

13. A method for manufacturing a double-side display structure for transparent organic light emitting diodes through a transparent cathode structure, comprising steps of:

a. plating an organic layer on an OLED element by vaporization;

b. plating an organic protection layer on the organic layer to protect organic layers from being damaged by electron bombardment during the OLED element subject to ITO sputtering in a later processing;

c. plating an electron injecting layer and a thin metal film of a mating energy level on the organic protection layer; and d. plating a transparent conductive film on the electron injecting layer and the thin metal film to increase conductivity and protect the thin metal film from corrosion.

* * * * *